US012010830B2

(12) United States Patent
Chen et al.

(10) Patent No.: US 12,010,830 B2
(45) Date of Patent: Jun. 11, 2024

(54) METHOD OF MANUFACTURING A SEMICONDUCTOR STRUCTURE BY FORMING A NODE CONTACT BETWEEN A BIT LINE AND AN ISOLATION LINE

(71) Applicant: CHANGXIN MEMORY TECHNOLOGIES, INC., Hefei (CN)

(72) Inventors: Wenli Chen, Hefei (CN); Ming-Pu Tsai, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 415 days.

(21) Appl. No.: 17/467,635

(22) Filed: Sep. 7, 2021

(65) Prior Publication Data

US 2022/0085033 A1    Mar. 17, 2022

Related U.S. Application Data

(63) Continuation of application No. PCT/CN2021/103691, filed on Jun. 30, 2021.

(30) Foreign Application Priority Data

Sep. 15, 2020  (CN) .......................... 202010966605.1

(51) Int. Cl.
  *H10B 12/00* (2023.01)
  *H01L 21/311* (2006.01)
  *H01L 21/762* (2006.01)

(52) U.S. Cl.
  CPC ...... *H10B 12/485* (2023.02); *H01L 21/31144* (2013.01); *H01L 21/76224* (2013.01);
  (Continued)

(58) Field of Classification Search
  CPC .. H10B 12/0335; H10B 12/09; H10B 12/481; H01L 21/3114; H01L 21/76224; H01L 21/76229; H01L 21/76232
  See application file for complete search history.

(56) References Cited

U.S. PATENT DOCUMENTS 8,207,611 B2    6/2012  Saeki
8,309,412 B2    11/2012 Cho
(Continued)

FOREIGN PATENT DOCUMENTS

CN    101794736 A    8/2010
CN    103247577 A    8/2013
(Continued)

OTHER PUBLICATIONS

CN-114188284-A (Machine Translation) (Year: 2022).*
CN-108933136-B (Machine Translation) (Year: 2018).*

*Primary Examiner* — Younes Boulghassoul
(74) *Attorney, Agent, or Firm* — Cooper Legal Group, LLC (57) ABSTRACT

A method for forming a semiconductor structure and a semiconductor structure. The method includes: a semiconductor base which has a substrate and a first oxide material layer arranged on the substrate is provided. Pattern etching is performed on the first oxide material layer, to remove the first oxide material layer in the second region and that in a part of the first region, and the remaining first oxide material layer forms oxide line structures on both sides of each bit line structure; a second material is backfilled, to form an isolation line structure in the first region and a dummy isolation structure in the second region; remove the oxide line structures are removed, the bit line structures and the isolation line structures on both sides jointly form through hole structures exposing the substrate; and a conductive material layer is formed in the through hole structures to form the semiconductor structure.

9 Claims, 8 Drawing Sheets

(52) U.S. Cl.
CPC ......... *H10B 12/0335* (2023.02); *H10B 12/09* (2023.02); *H10B 12/482* (2023.02)

(56) References Cited

U.S. PATENT DOCUMENTS

| | | | |
|---|---|---|---|
| 8,324,049 | B2 | 12/2012 | Kim |
| 8,435,855 | B2 | 5/2013 | Kim |
| 8,865,547 | B2 | 10/2014 | Kang |
| 9,184,168 | B2 | 11/2015 | Ryu |
| 9,379,004 | B1 | 6/2016 | Kwon et al. |
| 9,608,077 | B1 | 3/2017 | Kye et al. |
| 10,269,808 | B2 | 4/2019 | Kim et al. |
| 10,847,519 | B2 | 11/2020 | Ji et al. |
| 10,943,908 | B2 | 3/2021 | Bae et al. |
| 2009/0140437 | A1 | 6/2009 | Saeki |
| 2010/0197121 | A1 | 8/2010 | Kim |
| 2011/0151632 | A1 | 6/2011 | Cho |
| 2013/0196477 | A1* | 8/2013 | Kang ............... H10B 12/09 438/270 |
| 2014/0131786 | A1* | 5/2014 | Ryu ............... H10B 12/09 257/316 |
| 2016/0181143 | A1* | 6/2016 | Kwon ............... H10B 12/315 438/586 |
| 2017/0069726 | A1 | 3/2017 | Kye et al. |
| 2017/0323893 | A1 | 11/2017 | Kim et al. |
| 2019/0296026 | A1* | 9/2019 | Ji ............... H10B 12/485 |
| 2020/0098763 | A1 | 3/2020 | Bae et al. |

FOREIGN PATENT DOCUMENTS

| | | | | |
|---|---|---|---|---|
| CN | 103811554 | A | | 5/2014 |
| CN | 105719998 | A | | 6/2016 |
| CN | 106504985 | A | | 3/2017 |
| CN | 107393918 | A | | 11/2017 |
| CN | 108933136 | A | | 12/2018 |
| CN | 110364479 | A | | 10/2019 |
| CN | 110943085 | A | | 3/2020 |
| CN | 110970351 | A | | 4/2020 |
| CN | 210607254 | U | | 5/2020 |
| CN | 114188284 | A | * | 3/2022 ......... H01L 21/0273 |
| CN | 108933136 | B | * | 9/2023 ............. H10B 12/34 |

* cited by examiner

METHOD OF MANUFACTURING A SEMICONDUCTOR STRUCTURE BY FORMING A NODE CONTACT BETWEEN A BIT LINE AND AN ISOLATION LINE

CROSS-REFERENCE TO RELATED APPLICATIONS

This is a continuation of the International Application No. PCT/CN2021/103691, filed on Jun. 30, 2021 and entitled "METHOD FOR FORMING SEMICONDUCTOR STRUCTURE AND SEMICONDUCTOR STRUCTURE", which claims priority to Chinese Patent Application No. 202010966605.1, filed on Sep. 15, 2020 and entitled "METHOD FOR FORMING SEMICONDUCTOR STRUCTURE AND SEMICONDUCTOR STRUCTURE". The contents of International Application No. PCT/CN2021/103691 and Chinese Patent Application No. 202010966605.1 are incorporated herein by reference in their entireties.

TECHNICAL FIELD

The disclosure relates to the technical field of semiconductors, and in particular to, a method for forming a semiconductor structure and a semiconductor structure.

BACKGROUND

In a process step of forming a node contact (NC) in an existing dynamic random access memory (DRAM), in order to ensure the uniformity in the manufacturing process of a valid node contact, some dummy node contacts will be formed at an edge part. However, silicon oxide in holes of these dummy node contacts will have some unstable factors in the subsequent manufacturing process, which causes unnecessary device failures. For example, the silicon oxide in the holes is eroded by hydrofluoric acid in the subsequent cleaning step, causing that the subsequent conductive metal tungsten will also fill the dummy node contacts when it fills the NC and PC, so that stray capacitances of a bit line (BL) and a BL are increased. For another example, when the silicon oxide in the holes of the valid node contact is cleaned and removed by using the hydrofluoric acid, the dummy node contacts can be covered with a photoresist to prevent erosion. However, in the actual process, when the coverage or adhesiveness of the photoresist is poor, the hydrofluoric acid will penetrate into a second region and erode the silicon oxide in it, causing that the metal tungsten (W) of PC/NC in the subsequent process fills the holes of the dummy node contacts and resulting in poor bit line-bit line short circuit.

SUMMARY

According to one aspect of the disclosure, a method for forming a semiconductor structure is provided, including the following steps:
provideing a semiconductor base which has a substrate and a first oxide material layer arranged on the substrate, the first oxide material layer including a first region provided with bit line structures and a second region located at an edge of the first region;
performing pattern etching on the first oxide material layer, removing the first oxide material layer of the second region and part of the first oxide material layer of the first region to enable the remaining first oxide material layer to form oxide line structures on both sides of each bit line structure;
backfilling the first region and the second region with a second material which is different from a material of the first oxide material layer, the second material located in the first region forming an isolation line structure;
performing pattern etching on to remove the oxide line structures, the bit line structures and the isolation line structures on both sides jointly forming through hole structures exposing the substrate; and
forming a conductive material layer in the through hole structures to form the semiconductor structure.

According to another aspect of the disclosure, a semiconductor structure is provided. The semiconductor structure includes a substrate, a plurality of bit line structures, a plurality of isolation line structures, and a dummy isolation layer. The substrate has a first region and a second region. The plurality of bit line structures are arranged in the first region of the substrate. The plurality of isolation line structures are arranged in the first region of the substrate. The isolation line structures are located between two adjacent bit line structures, so that through hole structures that expose the substrate are respectively formed on both sides of the bit line structures. The dummy isolation layer is arranged in the second region of the substrate.

REFERENCE SIGNS ARE DESCRIBED BELOW

110: substrate;
120: first oxide material layer;
130: bit line structure;
140: oxide line structure;
150: dummy isolation layer;
160: isolation line structure;
210: first mask layer;
220: second mask layer;
300: first photoresist;
400: second oxide material layer;
500: organic silicon layer;
600: second photoresist;
700: third photoresist;
D1: first region;
D2: second region;
M1: first mask pattern;
M2: second mask pattern;
M3: third mask pattern.

DETAILED DESCRIPTION

Example implementation modes will be now described more comprehensively with reference to the accompanying drawings. However, the example implementation modes can be implemented in a variety of forms and should not be construed as being limited to the implementation modes set forth herein. Rather, these implementation modes are provided to make the disclosure more comprehensive and complete, and fully convey the concept of the example implementation modes to those skilled in the art. The same reference signs in the drawings denote the same or similar structures, and a repetitive description thereof will be omitted.

In this exemplary implementation mode, a method for forming a semiconductor structure provided in the disclosure is described by taking formation of a node contact applied to a dynamic random access memory (DRAM) as an example. It is easy for those skilled in the art to understand that, in order to apply the relevant design of the disclosure to a formation process of node contacts of other types of semiconductor structures, various modifications, additions, substitutions, deletions or other changes are made to the following specific implementation modes. These changes are still within the scope of the principle of the method for forming a semiconductor structure provided in the disclosure.

One main purpose of the disclosure is to overcome at least one defect of the above existing technology and provide a method for forming a semiconductor structure, which can optimize the stability of a node contact of a second region.

Another main purpose of the disclosure is to overcome at least one defect of the above existing technology and provide a semiconductor structure with relatively high stability of a node contact of a second region.

In the method for forming the semiconductor structure provided by the disclosure, the second region can be filled with the second material that is not an oxide, so that a hole of a node contact of the second region is filled with a nitride to accordingly replace the oxide in the hole of the node contact of the second region. In a node contact structure of the semiconductor structure prepared by the method for forming a semiconductor structure provided by the disclosure, the instability of the node contact in the second region is greatly reduced, and the stability and the reliability of the semiconductor structure are improved.

Figure 7:
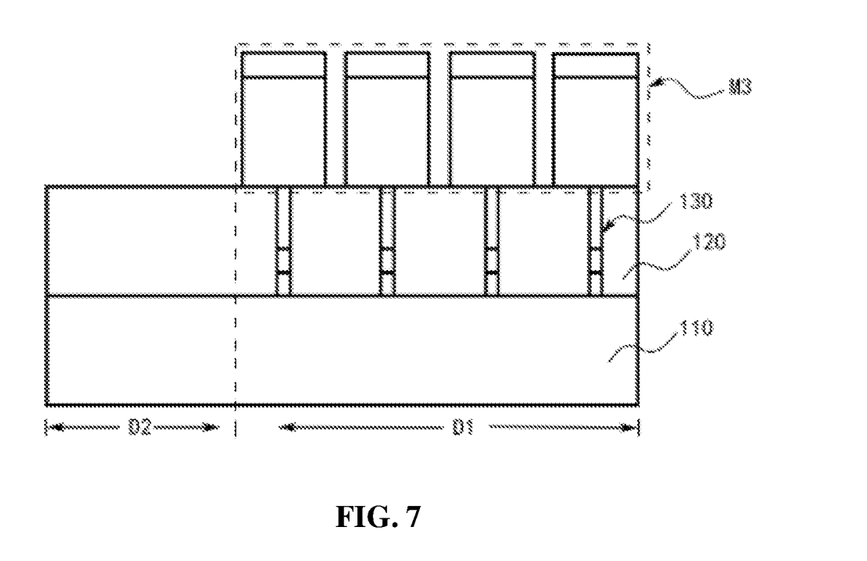
FIG. 7 is a schematic diagram of a semiconductor structure in another step of a method for forming a semiconductor structure illustrated according to one exemplary implementation mode.
Figure 8:
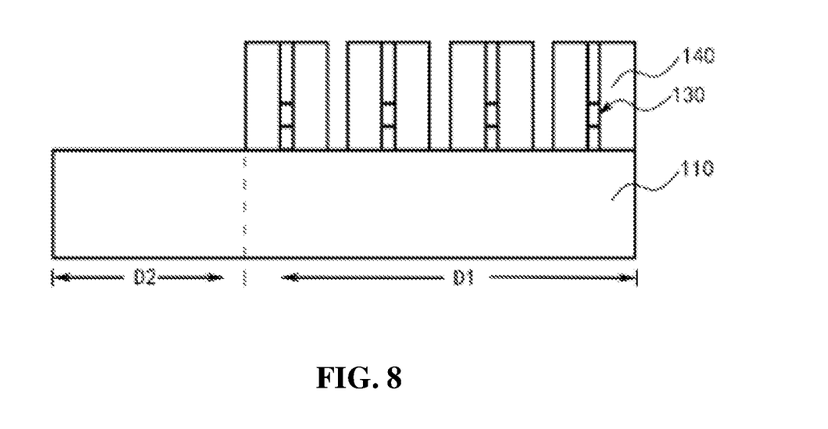
FIG. 8 is a schematic diagram of a semiconductor structure in another step of a method for forming a semiconductor structure illustrated according to one exemplary implementation mode.
Figure 9:
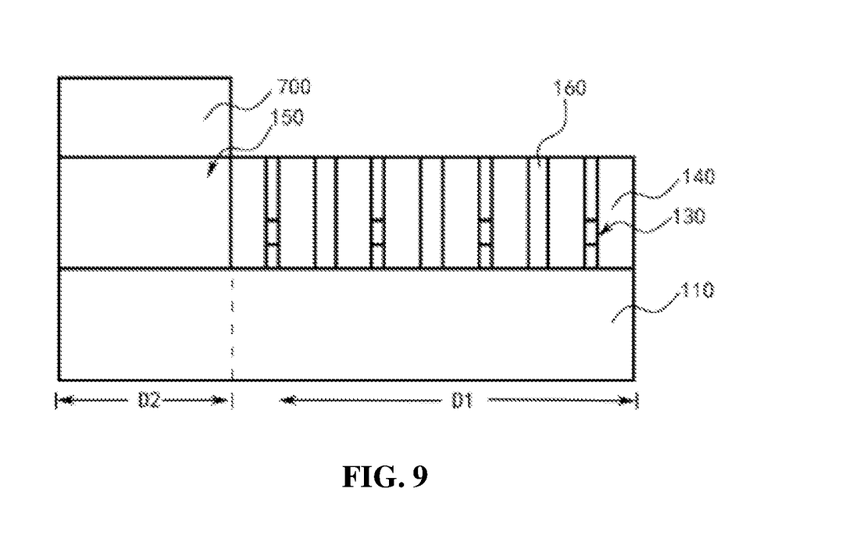
FIG. 9 is a schematic diagram of a semiconductor structure in another step of a method for forming a semiconductor structure illustrated according to one exemplary implementation mode.
Figure 11:
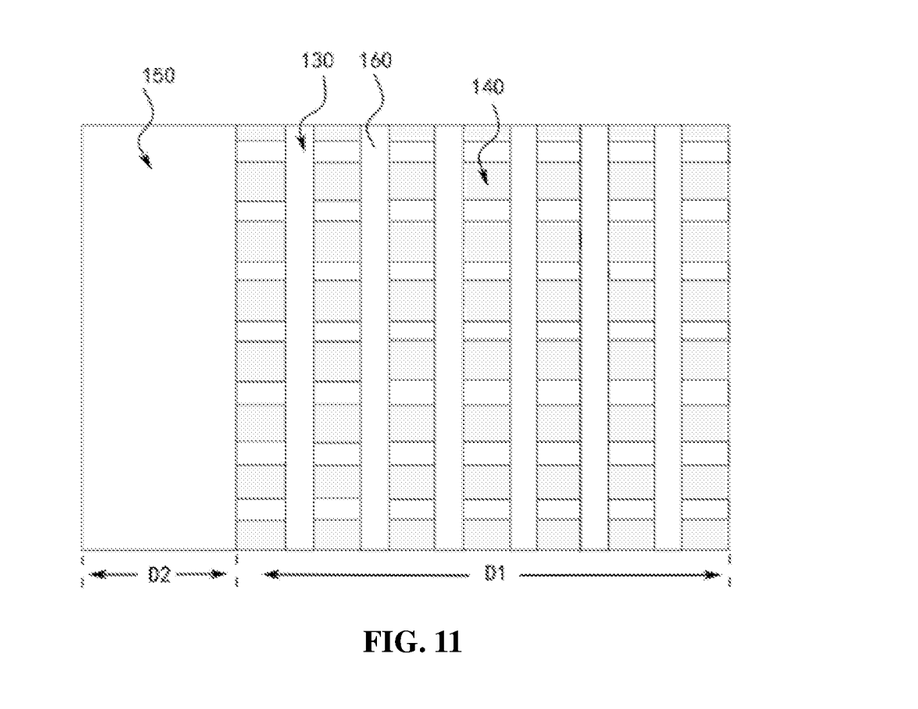
FIG. 11 is a top view of the semiconductor structure in the step illustrated in FIG. 9.
Figure 12:
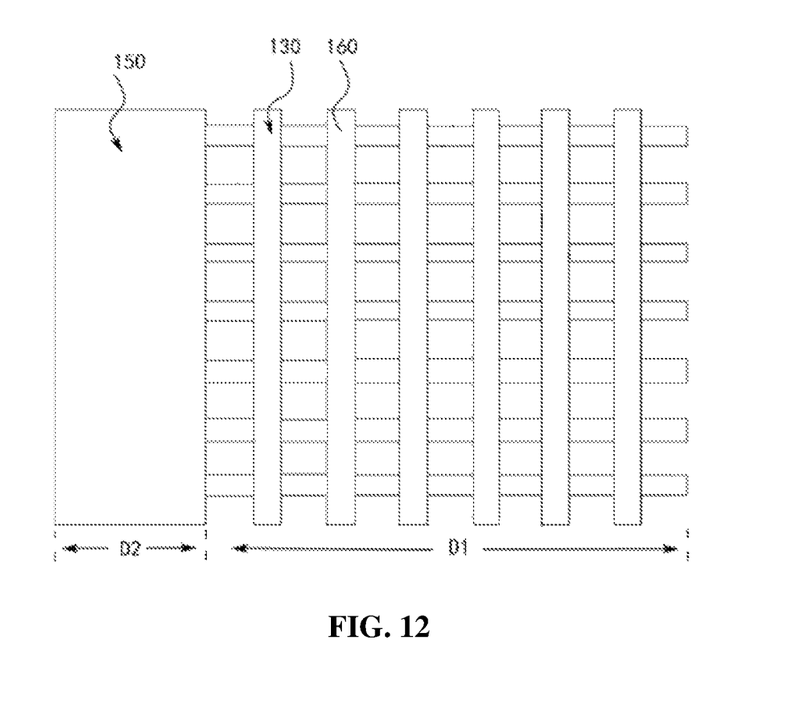
FIG. 12 is a top view of the semiconductor structure in the step illustrated in FIG. 10.

FIG. 1 to FIG. 10 each illustrates a schematic diagram of a semiconductor structure in a respective step of a method for forming a semiconductor structure provided in the disclosure. With cooperative reference to FIG. 11 and FIG. 9, FIG. 11 illustrates a top view of the semiconductor structure in the step shown in FIG. 9, and FIG. 12 illustrates the semiconductor structure in the step shown in FIG. 10. The processes, methods, and relationships of the main constituent steps of the method for forming a semiconductor structure provided in the disclosure will be described in detail below in conjunction with the above-mentioned drawings.

As shown in FIG. 1 to FIG. 10, in the present implementation mode, the method for forming a semiconductor structure provided in the disclosure includes the following steps.

A semiconductor base is provided. The semiconductor substrate has a substrate 110 and a first oxide material layer 120 disposed on the substrate 110. The first oxide material layer 120 includes a first region D1 provided with bit line structures 130 and a second region D2 located at an edge of the first region D1.

Pattern etching is performed on the first oxide material layer 120, to remove the first oxide material layer 120 in the second region D2 and the first oxide material layer 120 in part of the first region D1 and to enable the first oxide material layer 120 in remaining part of the first region D1 to form oxide line structures 140 on both sides of each bit line structure 130.

The first region D1 and the second region D2 are backfilled with a second material. The second material is different from a material of the first oxide material layer 120. The second material located in the first region D1 forms an isolation line structure 160. The second material located in the second region D2 forms a dummy isolation layer 150.

The oxide line structures 140 removed by pattern etching. The bit line structures 130 and the isolation line structures 160 on both sides of each bit line structure jointly form through hole structures 170 exposing the substrate 110.

A conductive material layer is formed in the through hole structure 170 to form the semiconductor structure.

Optionally, as shown in FIG. 1 to FIG. 8, in this implementation mode, the pattern etching of the first oxide material layer 120 may specifically include the following steps.

A second mask layer 220 and a first mask layer 210 are sequentially arranged on the first oxide material layer 120.

Pattern etching is performed on the first mask layer 210 to form a first mask pattern M1.

A second oxide material layer 400 is arranged on a surface of the first mask pattern M1 and a surface of the second mask layer 220.

An organic silicon layer 500 is arranged on the second oxide material layer 400.

A part of the organic silicon layer 500 located above the first mask pattern M1 is removed by pattern etching, and parts of the second oxide material layer 400 located in the second region D2 and at the top and both sides of the first mask pattern M1 are removed to form a second mask pattern M2.

The second mask pattern M2 is used to etch and remove part of the second mask layer 220 to form a third mask pattern M3.

The first oxide material layer 120 is etched by using the third mask pattern M3.

It should be noted that, in any exemplary implementation mode conforming to the design concept of the disclosure, the pattern etching of the first oxide material layer 120 can also be achieved through other specific process steps, and is not limited to this implementation mode.

Figure 1:
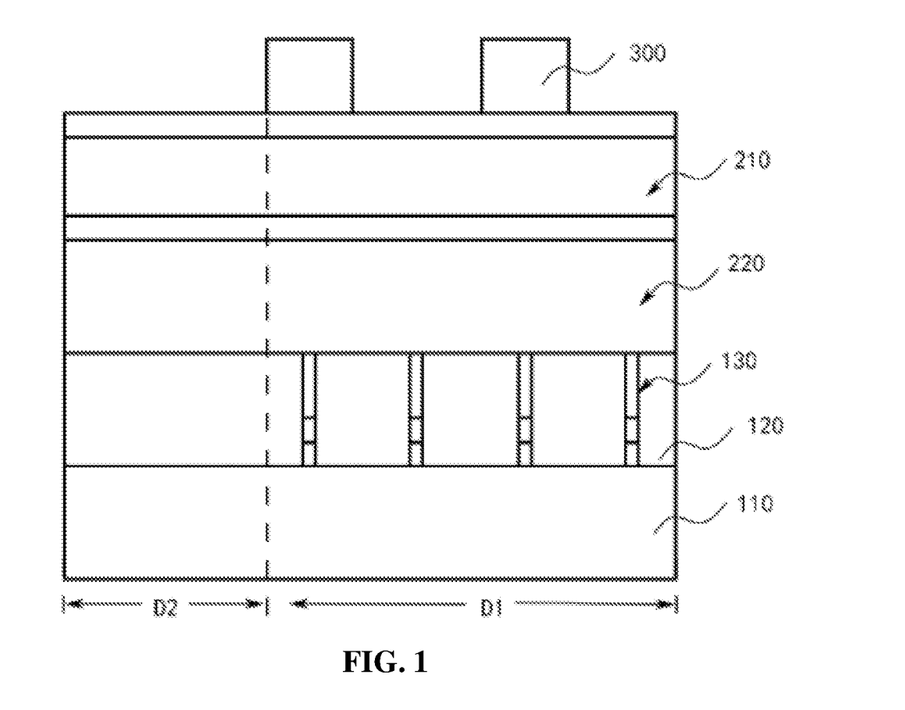
FIG. 1 is a schematic diagram of a semiconductor structure in one step of a method for forming a semiconductor structure illustrated according to one exemplary implementation mode.

Specifically, as shown in FIG. 1, an exemplary structure of the semiconductor structure in the steps of "providing a semiconductor substrate", "arranging a first mask layer 210 and a second mask layer 220" and "arranging a first photoresist 300" is illustrated. The semiconductor structure shown in the figure includes a semiconductor base, a first mask layer 210, a second mask layer 220, and a patterned first photoresist 300. The semiconductor base includes a substrate 110, a first oxide material layer 120 and a plurality of bit line structures 130. The first oxide material layer 120 is arranged on a surface of the substrate 110, and the bit line structures 130 are arranged on a part of the first oxide material layer 120 corresponding to the first region D1. The second mask layer 220 is arranged on a surface of the semiconductor base (i.e., the first oxide material layer 120). The first mask layer 210 is arranged on a surface of the second mask layer 220. The first photoresist 300 is arranged on a surface of the first mask layer 210.

Optionally, in this implementation mode, the substrate 110 may be a silicon substrate 110.

Optionally, in this implementation mode, a first oxide material may include silicon oxide (SiO2).

Optionally, in this implementation mode, each bit line structure 130 may include a metal layer (such as tungsten W), a plug (such as titanium nitride TiN), and a protective layer (such as silicon nitride Si3N4).

Optionally, in this implementation mode, the first mask layer 210 may include polycrystalline silicon and silicon oxynitride.

Optionally, in this implementation mode, the second mask layer 220 may include polycrystalline silicon and polycrystalline carbon.

Figure 2:
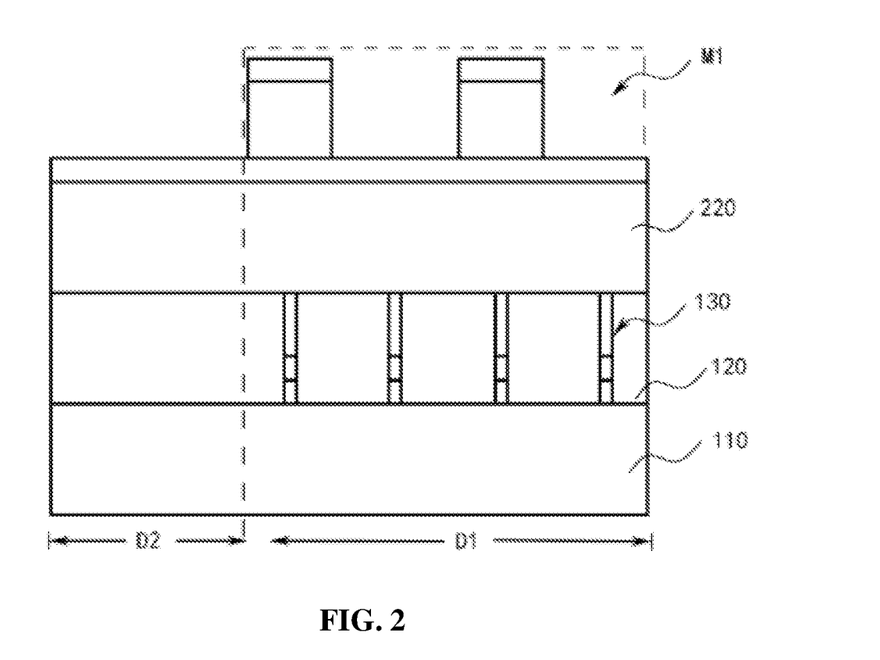
FIG. 2 is a schematic diagram of a semiconductor structure in another step of a method for forming a semiconductor structure illustrated according to one exemplary implementation mode.

Specifically, as shown in FIG. 2, an exemplary structure of the semiconductor structure in the steps of "forming a first mask layer 210" is illustrated. The semiconductor structure shown in the figure includes a base, a second mask layer 220, and a first mask pattern M1. The first mask pattern M1 is the first mask layer 210 formed after etching.

Optionally, as shown in FIG. 1 and FIG. 2, in this implementation mode, the step of "forming a first mask pattern M1" may specifically include the following steps.

A surface of the first mask layer 210 is covered by the first photoresist 300.

The first photoresist 300 is patterned, and the remaining first photoresist 300 respectively corresponds to the bit line structures 130. There is no first photoresist 300 on the surface of the part of the first mask layer 210 corresponding to the second region D2, as shown in FIG. 1.

The first photoresist 300 is used as a mask layer for etching to remove a part of the first mask layer 210 that is not covered by the first photoresist 300, and the remaining part of the first mask layer 210 forms the first mask pattern M1, as shown in FIG. 2.

Figure 3:
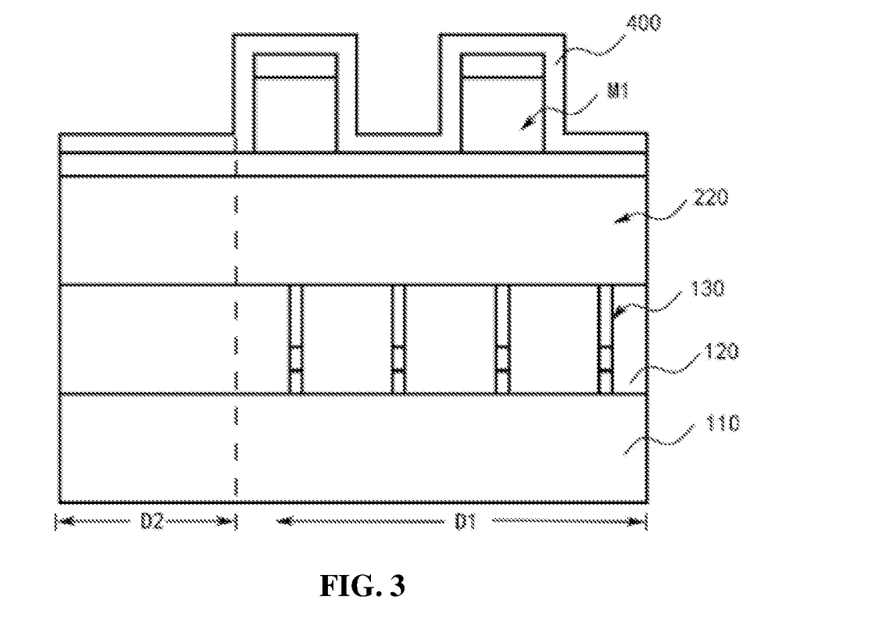
FIG. 3 is a schematic diagram of a semiconductor structure in another step of a method for forming a semiconductor structure illustrated according to one exemplary implementation mode.

Specifically, as shown in FIG. 3, an exemplary structure of the semiconductor structure in the step of "arranging a second oxide material layer 400" is illustrated. The semiconductor structure shown in the figure includes a base, a second mask layer 220, the remaining part of the first mask layer 210, and a second oxide material layer 400. The second oxide material layer 400 is provided on a surface of the first mask pattern M1 and a surface of the second mask layer 220 (the part not covered by the first mask pattern M1).

Optionally, in this implementation mode, a material of the second oxide material layer 400 may include silicon oxide.

Figure 4:
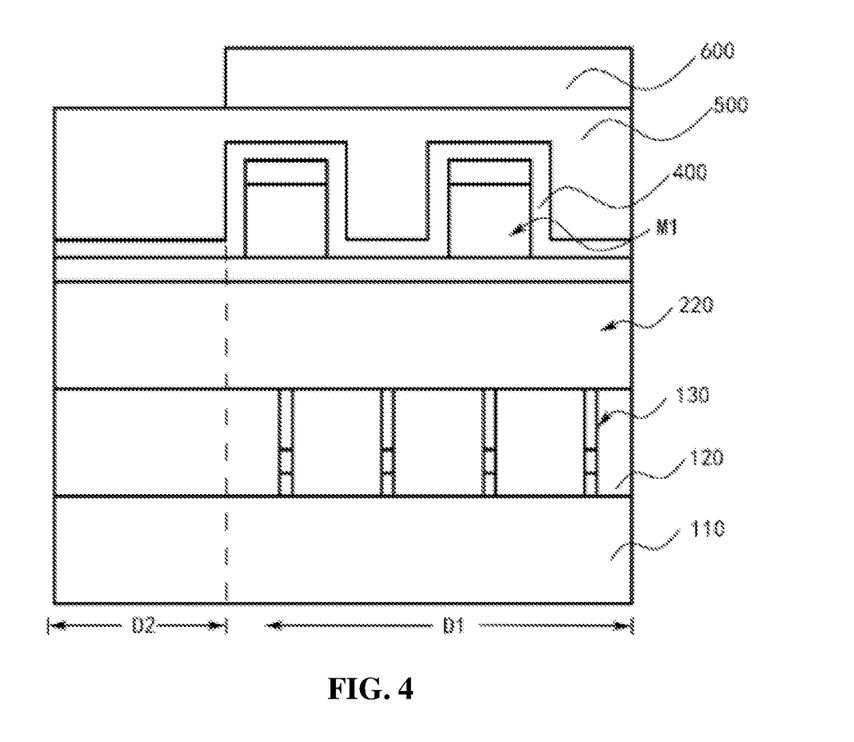
FIG. 4 is a schematic diagram of a semiconductor structure in another step of a method for forming a semiconductor structure illustrated according to one exemplary implementation mode.

Specifically, as shown in FIG. 4, an exemplary structure of the semiconductor structure in the steps of "arranging an organic silicon layer 500" and "arranging a second photoresist 600" is illustrated. The semiconductor structure shown in the figure includes a base, a second mask layer 220, the remaining part of the first mask layer 210, a second oxide material layer 400, an organic silicon layer 500, and a patterned second photoresist 600. The organic silicon layer 500 is arranged on a surface of the second oxide material layer 400, that is, the organic silicon layer 500 is filled between a gap of the first mask pattern M1 and in a part of the second oxide material layer 400 corresponding to the second region D2. The second photoresist 600 is arranged on a surface of the organic silicon layer 500.

Optionally, in this implementation mode, a material of the organic silicon layer 500 may include organic carbon (SiOC).

Figure 5:
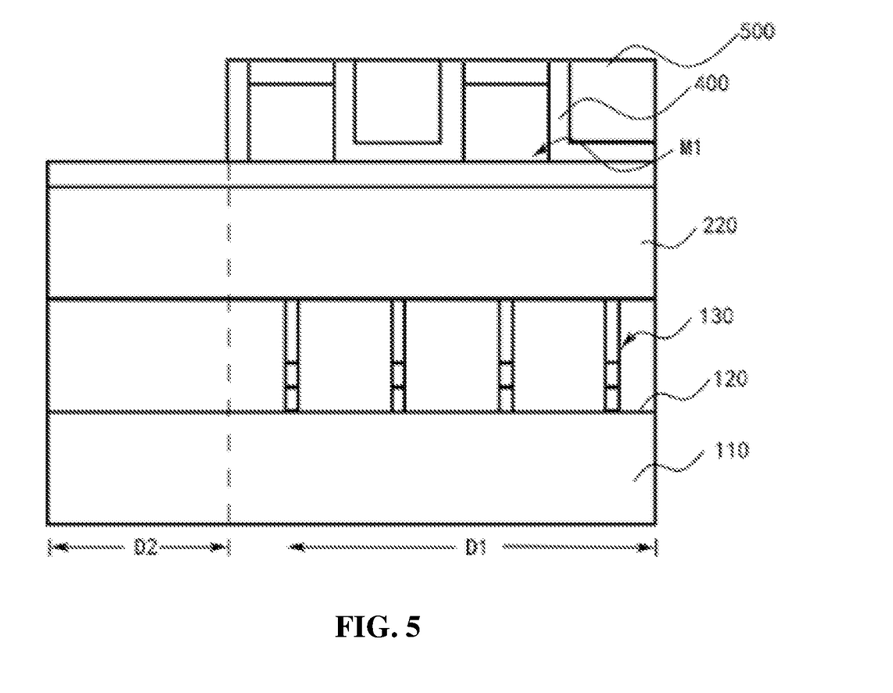
FIG. 5 is a schematic diagram of a semiconductor structure in another step of a method for forming a semiconductor structure illustrated according to one exemplary implementation mode.

Specifically, as shown in FIG. 5, an exemplary structure of the semiconductor structure in the step of "removing part of the organic silicon layer 500 by etching with the second photoresist 600" is illustrated. The semiconductor structure shown in the figure includes a base, a second mask layer 220, the remaining part of the first mask layer 210, the remaining part of the second oxide material layer 400, and the remaining part of the organic silicon layer 500. A part of the organic silicon layer 500 corresponding to the second region D2 and a part of the organic silicon layer 500 located above the first mask pattern M1 are removed by etching, that is, the remaining part of the organic silicon layer 500 is located in a gap of the remaining first mask layer 210. In addition, a part of the second oxide material layer 400 corresponding to the second region D2 and a part of the second oxide material layer 400 located at the top of the first mask pattern M1 are removed by etching.

Optionally, as shown in FIG. 4 and FIG. 5, in this implementation mode, the step of "removing part of the organic silicon layer 500 by etching with the second photoresist 600" may specifically include the following steps.

A surface of the organic silicon layer 500 is covered by the second photoresist 600.

The second photoresist 600 is patterned, and there is no second photoresist 600 on the surface of the part of the organic silicon layer 500 corresponding to the second region D2, as shown in FIG. 4.

The second photoresist 600 is used for etching to remove a part of the organic silicon layer 500 corresponding to the second region D2 and a part of the organic silicon layer 500 located above the first mask pattern M1, as shown in FIG. 5.

Figure 6:
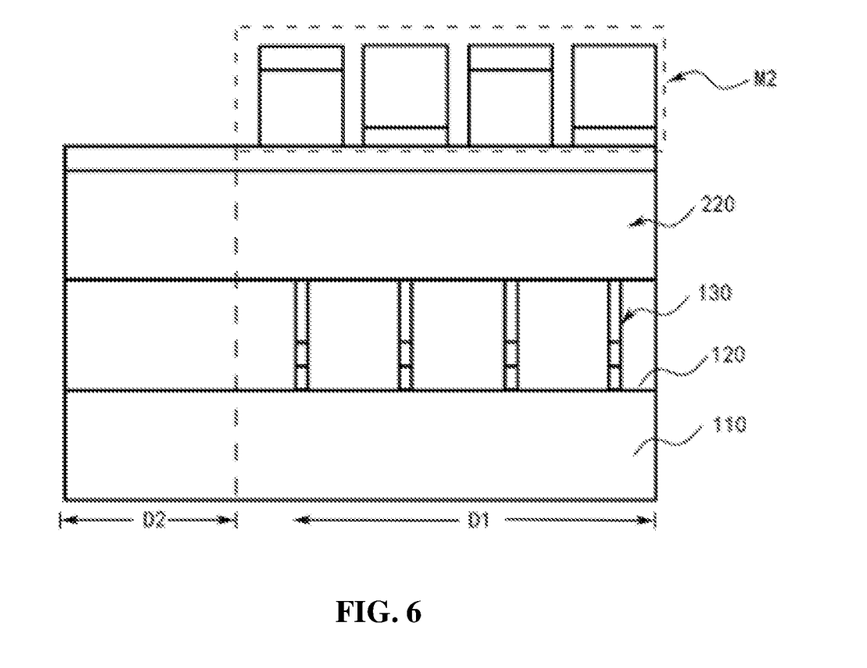
FIG. 6 is a schematic diagram of a semiconductor structure in another step of a method for forming a semiconductor structure illustrated according to one exemplary implementation mode.

Specifically, as shown in FIG. 6, an exemplary structure of the semiconductor structure in the step of "removing part of the second oxide material layer 400 to form a second mask pattern M2" is illustrated. The semiconductor structure shown in the figure includes a base, a second mask layer 220, and a second mask pattern M2. The remaining part of the first mask layer 210 (i.e., the first mask pattern M1), the remaining part of the second oxide material layer 400, and the remaining part of the organic silicon layer 500 jointly form the second mask pattern M2.

Optionally, as shown in FIG. 5 and FIG. 6, in this implementation mode, the etching for the second oxide material layer 400 can be divided into two steps. That is, FIG. 5 illustrates etching and removal of a part of the second oxide material layer 400 corresponding to the second region D2 and a part of the second oxide material layer 400 located at the top of the first mask pattern M1. FIG. 6 illustrates etching and removal of parts of the second oxide material layer 400 located on both sides of the first mask pattern M1. Through the above-mentioned etching process, the remaining second oxide material layer 400 finally includes only a part covered by the remaining part of the organic silicon layer 500.

Specifically, as shown in FIG. 7, an exemplary structure of the semiconductor structure in the step of "forming a third mask pattern M3 by using the second mask pattern M2" is illustrated. The semiconductor structure shown in the figure includes a base and a third mask pattern M3. The third mask pattern M3 is the remaining second mask layer 220 after etching with the second mask pattern M2, and the third mask pattern M3 corresponds to the plurality of bit line structures 130 in the first region D1.

Optionally, as shown in FIG. 7, in this implementation mode, the step of "forming the third mask pattern M3 by using the second mask pattern M2" may specifically include the following steps.

The second mask pattern M2 is used for etching to remove the part of the second mask layer 220 that is not covered by the second mask pattern M2, and the remaining second mask layer 220 forms the third mask pattern M3. In the above etching process, the second mask pattern M2 is removed at the same time, as shown in FIG. 7.

Specifically, as shown in FIG. 8, an exemplary structure of the semiconductor structure in the step of "removing part of the first oxide layer to form an oxide line structure 140" is illustrated. The semiconductor structure shown in the figure includes a base 110 and a plurality of oxide line structures 140. Each oxide line structure 140 includes the remaining first oxide material layer 120 after etching and removal, and the remaining first oxide material layer 120 is located on both sides of the bit line structure 130.

Optionally, as shown in FIG. 8, the step of "removing part of the first oxide layer to form an oxide line structure 140" may specifically include the following steps.

The third mask pattern M3 is used for etching to remove the part of the first oxide material layer 120 that is not covered by the third mask pattern M3. The remaining first oxide material layer 120 is located on both sides of each bit line structure 130, and the plurality of line structures 140 are arranged at intervals, as shown in FIG. 8.

Specifically, as shown in FIG. 9 and FIG. 11, an exemplary structure of the semiconductor structure in the step of "backfilling a second material to form an isolation line structure 160" is illustrated. The semiconductor structure shown in the figure includes a substrate 110, a plurality of bit line structures 130, a plurality of oxide line structures 140, and a backfilling second material. The second material fills a surface of the substrate 110 corresponding to the second region D2, thereby forming a dummy isolation layer 150 containing the second material in the second region D2. At the same time, the second material also fills the gaps of the plurality of oxide line structures 140, so that the isolation line structures 160 with a material including the second material are formed in the gaps of the bit line structures 130.

Optionally, in this implementation modes, the material of the backfilling second material may include silicon nitride.

Figure 10:
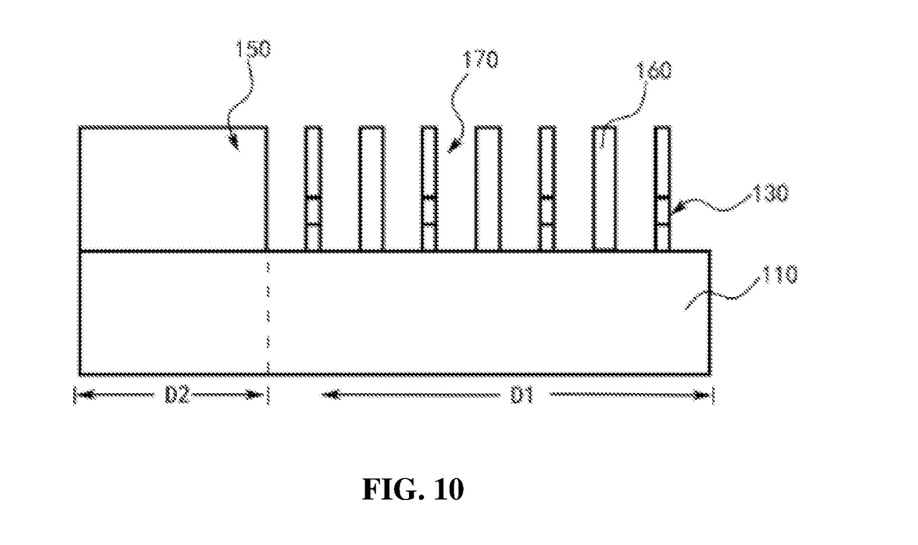
FIG. 10 is a schematic diagram of a semiconductor structure in another step of a method for forming a semiconductor structure illustrated according to one exemplary implementation mode.

Specifically, as shown in FIG. 10 and FIG. 12, an exemplary structure of the semiconductor structure in the step of "arranging an oxide line structure 140" is illustrated. The semiconductor structure shown in the figure includes a substrate 110, a plurality of bit line structures 130, a dummy isolation layer 150, and a plurality of isolation line structures 160. The dummy isolation layer 150 is located in the second region D2 of the substrate 110, and the isolation line structures 160 are located in the gaps of the bit line structures 130.

Optionally, as shown in FIG. 9 to FIG. 12, in this implementation mode, the step of "removing the oxide line structure 140" may specifically include the following steps.

The surfaces of the various bit line structures 130 backfilled with the second material are covered by a third photoresist 700.

The third photoresist 700 is patterned, and the part of the third photoresist 700 corresponding to the first region D1 is removed. That is, the third photoresist 700 is left on the surface of the dummy isolation layer 150, as shown in FIG. 9 and FIG. 11.

The third photoresist 700 is used for etching to remove the remaining first oxide material layer 120, as shown in FIG. 10 and FIG. 12.

Further, in this implementation mode, for the step of "removing the remaining first oxide material layer 120", an etching solution (such as a hydrofluoric acid solution) may be used to rinse the remaining first oxide material layer 120.

It should be noted here that the method for forming the semiconductor structure shown in the drawings and described in the present specification are only a few examples of many formation methods that can adopt the principles of the disclosure. It should be clearly understood that the principle of the disclosure is by no means limited to any details or any steps of the method for forming the semiconductor structure shown in the accompanying drawings or described in the present specification.

Based on the above detailed description of one exemplary implementation mode of the method for forming the semiconductor structure provided in the disclosure, one exemplary implementation mode of a semiconductor structure provided in the disclosure will be described below in conjunction with FIG. 10 and FIG. 12.

As shown in FIG. 10 and FIG. 12, in this implementation mode, the semiconductor structure provided in the present disclosure includes a substrate 110, a plurality of bit line structures 130, a plurality of isolation line structures 160, and a dummy isolation layer 150. Specifically, the substrate 110 has a first region D1 and a second region D2. The first region D1 and the second region D2 may be a valid region and a dummy region of the substrate 110, respectively. The plurality of bit line structures 130 are arranged in the first region D1 of the substrate 110. The plurality of isolation line structures 160 are arranged in the first region D1 of the substrate 110, and the isolation line structures 160 are located between two adjacent bit line structures 130, so that through hole structures 170 exposing the substrate 110 are formed on both sides of the bit line structures 130, respectively. The dummy isolation layer 150 is arranged in the second region D2 of the substrate 110. Materials of the isolation line structure 160 and the dummy isolation layer 150 may respectively include a material different from the first oxide material layer 120 of the substrate, such as silicon nitride.

It should be noted here that the semiconductor structures shown in the drawings and described in the present specification are only a few examples of many types of semiconductor structures that can adopt the principles of the disclosure. It should be clearly understood that the principle of the disclosure are by no means limited to any details of the semiconductor structure or any component of the semiconductor structure shown in the drawings or described in the present specification.

In conclusion, in the method for forming the semiconductor structure provided by the disclosure, the second region can be filled with the second material, so that a hole of a node contact of the second region is filled with the second material to accordingly replace the oxide in the hole of the node contact of the second region. In a node contact structure of the semiconductor structure prepared by the method for forming a semiconductor structure provided by the disclosure, the instability of the node contact in the second region is greatly reduced, and the stability and the reliability of the semiconductor structure are improved.

Although the disclosure has been described with reference to a few typical embodiments, it should be understood that the terms used are illustrative and exemplary rather than restrictive. Since the disclosure can be implemented in various forms without departing from the spirit or essence of the disclosure, it should be understood that the above-mentioned embodiments are not limited to any of the foregoing details, but should be interpreted broadly within the spirit and scope defined by the appended claims. Therefore, all changes and modifications falling within the scope of the claims or their equivalents shall be covered by the appended claims.

The invention claimed is:

1. A method for forming a semiconductor structure, comprising:
   providing a semiconductor base which has a substrate and a first oxide material layer arranged on the substrate, the first oxide material layer comprising a first region provided with bit line structures and a second region located at an edge of the first region;
   performing pattern etching on the first oxide material layer, to remove the first oxide material layer in the second region and the first oxide material layer in a part of the first region, and to enable the first oxide material layer in a remaining part of the first region to form oxide line structures on both sides of each of the bit line structures;
   backfilling the first region and the second region with a second material which is different from a material of the first oxide material layer, the second material located in the first region forming isolation line structures, and the second material located in the second region forming a dummy isolation layer;
   removing the oxide line structures by pattern etching, the bit line structures and the isolation line structures on both sides jointly forming through hole structures exposing the substrate; and
   forming a conductive material layer in the through hole structures to form the semiconductor structure.

2. The method for forming the semiconductor structure of claim 1, wherein the performing pattern etching on the first oxide material layer comprises:
   sequentially arranging a second mask layer and a first mask layer on the first oxide material layer;
   performing pattern etching on the first mask layer, to form a first mask pattern;
   arranging a second oxide material layer on a surface of the first mask pattern and a surface of the second mask layer;
   arranging an organic silicon layer on the second oxide material layer;
   removing a part of the organic silicon layer located above the first mask pattern, and parts of the second oxide material layer located in the second region and at a top and both sides of the first mask pattern by pattern etching, to form a second mask pattern;
   removing part of the second mask layer by etching using the second mask pattern, to form a third mask pattern; and
   etching the first oxide material layer by using the third mask pattern.

3. The method for forming the semiconductor structure of claim 2, wherein the performing pattern etching on the first mask layer comprises:
   arranging a first photoresist on a surface of the first mask layer;
   patterning the first photoresist; and
   etching the first mask layer by using the first photoresist.

4. The method for forming the semiconductor structure of claim 2, wherein the forming the second mask pattern comprises:
   arranging a second photoresist on a surface of the organic silicon layer;
   patterning the second photoresist, to maintain the second photoresist located in the first region; and
   performing etching by using the second photoresist, to form the second mask pattern.

5. The method for forming the semiconductor structure of claim 4, wherein the performing etching by using the second photoresist, to form the second mask pattern, comprises:
   removing the organic silicon layer located in the second region and above the first mask pattern, and the second oxide material layer located in the second region and at the top of the first mask pattern; and
   removing the second oxide material layer on the both sides of the first mask pattern.

6. The method for forming the semiconductor structure of claim 2, wherein a material of the organic silicon layer comprises organic carbon.

7. The method for forming the semiconductor structure of claim 1, wherein the removing the oxide line structures by pattern etching comprises:
   after backfilling the second material, covering the first oxide material layer and a surface of the second material with a third photoresist;
   patterning the third photoresist, to remove the third photoresist located in the first region; and
   performing etching by using the third photoresist, to remove the oxide line structures.

8. The method for forming the semiconductor structure of claim 7, further comprising:
   removing the first oxide material layer that is remaining by rinsing using an etching solution.

9. The method for forming the semiconductor structure of claim 1, wherein the second material comprises silicon nitride.

* * * * *